United States Patent [19]

Cutcher

[11] Patent Number: 5,421,256
[45] Date of Patent: Jun. 6, 1995

[54] ADJUSTABLE SQUEEGEE ASSEMBLY FOR SILK SCREEN PRINTERS

[76] Inventor: Thomas V. Cutcher, 5045 Summerfield Rd., Petersburg, Mich. 49270

[21] Appl. No.: 168,757

[22] Filed: Dec. 16, 1993

[51] Int. Cl.⁶ .............................................. B41F 15/46
[52] U.S. Cl. ...................................... 101/123; 101/114
[58] Field of Search ................ 101/114, 120, 123, 124, 101/157, 169, 365; 118/109, 203, 261, 413; 15/245, 256.51

[56] References Cited

U.S. PATENT DOCUMENTS

| | | | |
|---|---|---|---|
| 3,685,085 | 8/1972 | Jaffa | 101/114 |
| 3,828,671 | 8/1974 | Fuchs | 101/123 |
| 3,913,479 | 10/1975 | Cappel et al. | 101/365 |
| 4,102,266 | 7/1978 | Porth | 101/124 |
| 4,329,936 | 5/1982 | Heist et al. | 101/123 |
| 4,638,733 | 1/1987 | Schneider et al. | 101/114 |
| 4,648,317 | 3/1987 | Bubley et al. | 101/123 |
| 4,779,529 | 10/1988 | Ericsson | 101/123 |
| 4,841,854 | 6/1989 | Bubley | 101/123 |
| 4,940,354 | 7/1990 | Holderegger et al. | 101/169 |
| 4,957,045 | 9/1990 | Messerschmitt | 101/123 |
| 4,989,512 | 2/1991 | Lindstrom et al. | 101/123 |
| 4,995,316 | 2/1991 | Kölblin et al. | 101/123 |
| 5,070,783 | 12/1991 | Ireton | 101/157 |
| 5,078,063 | 1/1992 | Johansen et al. | 101/123 |

OTHER PUBLICATIONS

"Polyurethane Squeegees!", Wire Cloth Enterprises, Inc., Screen Printing—Jun. 1978, p. 66.

Primary Examiner—Edgar S. Burr
Assistant Examiner—Stephen R. Funk
Attorney, Agent, or Firm—Marshall & Melhorn

[57] ABSTRACT

A squeegee assembly including an outer pair of longitudinal plate brackets secured about a squeegee holder for retaining and positioning a squeegee blade. The squeegee holder secures the squeegee blade and is connected to positioning shafts at each end of the outer brackets. The positioning shafts may be rotated to adjust the position of the squeegee holder and blade, which retains the printing edge of the blade at the desired distance from a slotted opening in the outer brackets. The squeegee holder may consist of one or two longitudinal bars and includes a longitudinal flange which is positioned in a longitudinal groove in the squeegee blade to ensure the proper retention of the squeegee blade. The outer brackets are secured at the top end and include a longitudinal groove for connecting the squeegee assembly to the carriage of the screen printing apparatus. Rotating the positioning shafts positions the squeegee blade which extends from the squeegee holder through a slotted opening in the bottom of the outer brackets. A pair of locking bolts are used to lock the squeegee holder in the desired position and to align the squeegee blade.

16 Claims, 3 Drawing Sheets

ADJUSTABLE SQUEEGEE ASSEMBLY FOR SILK SCREEN PRINTERS

BACKGROUND OF THE INVENTION

1. Field of the Invention

The invention relates to a novel squeegee assembly used in a screen printing apparatus, and in particular to a squeegee assembly with a positioning mechanism for adjusting the position of the squeegee blade within the assembly such that the length of the squeegee blade extension remains constant during extended use of the blade in a screen printing process.

2. Summary of Related Art

Screen printing is an important process in making automotive glass and other glass components, for making printed circuit boards, and for a number of other applications where a specific pattern is printed on a hard substrate surface. In the glass manufacturing process, screen printing is used to print the electrically conducting networks for heater arrays on rear windows and back lights and to print shaded bands around the edges of the window glass. In printed circuit boards, screen printing is used to print the conducting networks on the circuit board.

Screen printing presses are also used for body printing-package printing applications. Presses print on both flat and curved surfaces and are used in a variety of industries.

In the various manual and automatic screen printing apparatus, a flood bar and a squeegee blade are mounted on a carriage in the printing press. The press includes a control system to control both vertical and horizontal motion of the squeegee blade assembly and/or the carriage. A screen with the desired pattern is placed in contact with the object being printed. The flood bar is used to distribute ink across the screen in a first pass over the screen. The flood bar is raised and the squeegee blade is lowered and drawn across the screen to force the ink through the screen onto the workpiece to be printed upon in a pattern determined by art work formed on the screen.

In some presses, the drive carriage will include only a single squeegee blade. The squeegee blade is pressed across the screen in one direction to force ink through the screen in any of the apertures in the screen coating. A return run of the squeegee blade back across the screen forces the ink onto the surface of the workpiece.

The squeegee blade is made of rubber and is typically mounted in a holder consisting of two face plates extending over the entire length of the squeegee rubber, clamping the squeegee rubber therebetween. In order to achieve pressure on the working edges of the squeegee on a screen, without ripping the screen, the elasticity of the rubber material in the squeegee blades is utilized. This takes place in such manner that the clamping location of the squeegee blade between the face plates is provided at a preferred distance from the working edge of the squeegee blade. The elastic rubber material of the squeegee blade extending from the face plates develops an even pressure over the entire length of the working edge during the printing process.

One of the disadvantages of the squeegee assemblies is that the working edge of the squeegee blade deteriorates after only a relatively short period of use, so that the squeegee rubber is no longer in the position to produce the contact pressure necessary for a satisfactory printing result. In addition, the working edge of the squeegee blade wears unevenly such that the contact pressure is uneven and the quality of the print deviates from acceptable standards.

The positioning and physical condition of the squeegee blade effects both the quality of the printing and the life of the screen used in the printing process. If the squeegee blade is not properly mounted in the holder, waves or buckles will occur in the blade as pressure is applied and the force used to print the pattern will be uneven. Consequently, the printed pattern will not be uniform.

The stiffness or resiliency of the squeegee blade is an important factor in the printing process. The resulting pattern printed on a substrate may be effected by changes in the resiliency of the blade material.

Nicks or chips in the edge of the squeegee blade will also cause printing defects. In addition, the rough edges have a tendency to catch on and rip a screen. Once a screen is ripped, it is no longer usable and a new screen must be installed. The time and costs involved with unscheduled screen changes have an adverse effect on the overall screen printing process.

In order to overcome the disadvantages noted above, the squeegee blade will be reconditioned or replaced on a frequent basis. Because the cost of the squeegee blades is not insignificant, most users will attempt to recondition the squeegee blades to increase the life of the blade. One of the desired features is the ability to take one holder from the carriage and place a second holder in the carriage without having to adjust the carriage drives and positioning systems. In most cases, the carriage must be adjusted each time the squeegee blade is changed. Such carrier adjustment requirement results in additional manpower requirements, production delays, and scrap material.

When the blade is reconditioned, the working edge is trimmed, ground, and/or sanded to provide a new, smooth edge which produces the desired contact pressure.

One of the major problems in reconditioning the squeegee blade is providing a squeegee assembly which will enable a used squeegee blade to be attached to the holder in a manner which will impart to the blade the same rigidity or stiffness as that possessed by the blade prior to being reconditioned. This requires a blade which after being reconditioned one or more times is still able to extend beyond the squeegee holder the same distance as a new blade.

A desired feature for the squeegee blade holder is the ability to maintain the same blade stiffness by allowing the working edge of the blade extending from the holder to be maintained at a constant distance. The squeegee blade exhibits a degree of stiffness or rigidity which is essentially independent of the height dimension of the blade and solely dependent on the size of that part of the blade which extends beyond the squeegee holder. The holder should provide a convenient and simple means of retaining the blade in the squeegee holder and for adjusting the extension of the blade from the holder.

In the screen printing industry, there is still a need for an improved squeegee holder with a means for retaining the squeegee, and for adjustably positioning the squeegee in the holder to maintain the specified blade extension and resulting pressure on the working edge of the blade. An improved squeegee holder with total adjustability of the extension distance of the squeegee blade from the holder will decrease the blade material which must be scrapped, and decrease the amount of time needed to change out and adjust a squeegee holder.

A number of U.S. patents have discussed a squeegee holder assembly for use with carriers on various the printing systems. U.S. Pat. No. 5,078,063 to Johansen et al. discloses a squeegee holder with a levelness control and a pressure control for the squeegee blade. A wedge is positioned between a stationary body and the squeegee blade. A micrometer is used to adjust the level of the squeegee.

An alternative squeegee arrangement is shown in U.S. Pat. No. 4,989,512 to Lindstrom et al. The squeegee is maintained at an angle and includes a plurality of defined support positions. The squeegee holder has two plates to secure the squeegee, and both of the plates have three grooves into which a flat bar is inserted. The three sets of grooves are at different heights on the face plate and the position of the squeegee blade in between the plates is determined by the positioning of the flat bar. The squeegee blade can be adjusted only in the incremental positions based on the spacing of the grooves.

U.S. Pat. No. 4,841,854 to Bubley shows a squeegee assembly with two face plates and a center bar. The face plates and the center bar have ribbed construction such that the position of the center bar determines the extension of the squeegee blade from between the plates. In order to adjust the position of the blade, all of the retention screws used to clamp the two face plates to secure the squeegee must be loosened. Retaining the squeegee blade in an even alignment is very difficult because there is no clamping means to retain the blade when an adjustment is taking place.

U.S. Pat. No. 4,779,529 to Ericsson discloses a squeegee system which maintains the squeegee blade at an obtuse or an acute angle, irrespective of the direction of relative squeegee movement.

A plurality of independent squeegee holder members are shown in U.S. Pat. No. 4,638,733 to Schneider et al. The squeegee holder has holder members which are guided for mutually independent reciprocating movement in the contact direction, and are held under contact force. Because the holder members are independent, the squeegee blade can better follow any unevenness in the screen during the printing process. This holder is used primarily when different wall thicknesses are encountered during the printing process.

SUMMARY OF THE INVENTION

In accordance with the present invention, there is provided a squeegee assembly, and in particular, a squeegee assembly having a pair of outer, longitudinal plate brackets for retaining and positioning a squeegee holder secured about a squeegee blade. The squeegee holder is connected to a positioning means inside of the outer brackets, the squeegee holder retaining the squeegee blade and adjusting the position of the squeegee blade to retain the printing edge of the blade at the desired distance from the slotted opening in the outer brackets.

In one embodiment, the squeegee blade is secured between the two inner plate brackets by a plurality of bolts joining the plate brackets along the top mounting edge of the blade. The top of the blade is provided with one or two longitudinal grooves extending the full length of the squeegee. The inner brackets have longitudinal flanges which are positioned in the grooves to ensure the proper retention of the squeegee blade.

In the other embodiments, the squeegee holder is the same width as the squeegee blade. The planar surfaces of the outer brackets engage both the squeegee holder and a portion of the squeegee blade. The holder includes a longitudinal, flanged edge for insertion into the corresponding grooves in the squeegee blade.

The outer brackets are joined together at the top end and include means for connecting the squeegee assembly to the carriage of the screen printing apparatus. The squeegee holder, positioned in between the two outer brackets, is mounted on two positioning shafts at each end of the outer brackets. Rotating the positioning shafts positions the squeegee blade which extends from the squeegee holder through a slotted opening in the bottom of the outer brackets. The lower ends of the two outer brackets slidingly engage the squeegee blade to provide support and control the stiffness of the blade when the blade is flexed during a printing cycle.

A pair of set screws are used to lock the inner brackets in the desired position and to align the inner brackets.

An object of the present invention is to provide a positioning means such that the extension of the squeegee from the mounting brackets can be adjusted quickly and accurately to achieve the desired contact force during the printing cycle. Current squeegee assemblies either have no adjustability as far as the blade positioning is concerned or require the brackets to be separated and the squeegee realigned within the brackets to achieve the desired positioning of the blade after the blade has been reconditioned.

A further object of the present invention is to use a taller squeegee blade and to provide for multiple reconditioning cycles before the blade is no longer usable. Such a feature would improve the utilization of the squeegee material, reduce the number of squeegee blades required for production operations, and reduce the amount of scrap squeegee blade material.

Another object of the present invention is to reduce the manpower requirements for squeegee assembly adjustments, blade reconditioning, and blade changes during production operations. The squeegee assembly of the present invention, with the taller blades, will reduce the number of blade changes required for each of the assemblies. In addition, the positioning and adjustment of the blade during the reconditioning process is easier and requires less time to complete.

An additional object of the present invention is to reduce the scrap material and production down time due to a squeegee change. In circumstances when the blade in use is worn and needs to be reconditioned or replaced, the changing of the squeegee assembly in a printing apparatus typically requires changes to the carriage operations. The pressures and the positioning of the carriage need to be adjusted to compensate for the different length and flex in the squeegee blade. Several print cycles will be needed to adjust the equipment and the resulting print will typically be unacceptable from a quality standpoint. Adjusting the inner brackets of the present invention to achieve the same general squeegee blade extension and flex will save set up time and reduce the number of parts rejected when changing the blade on the printing apparatus.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
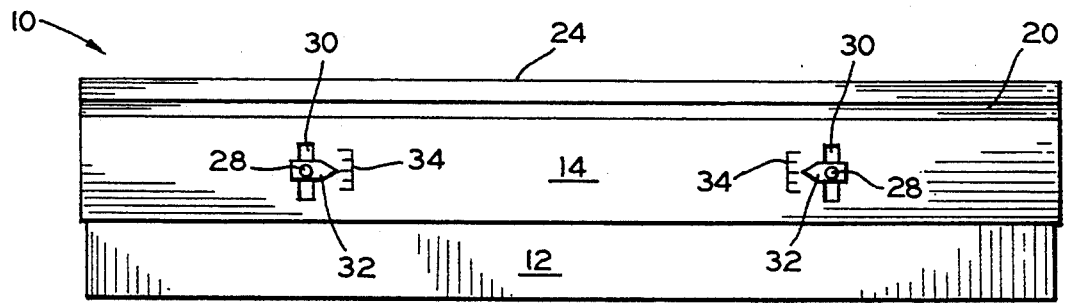
FIG. 1 is a front elevational view of the squeegee assembly of the present invention.
Figure 2:
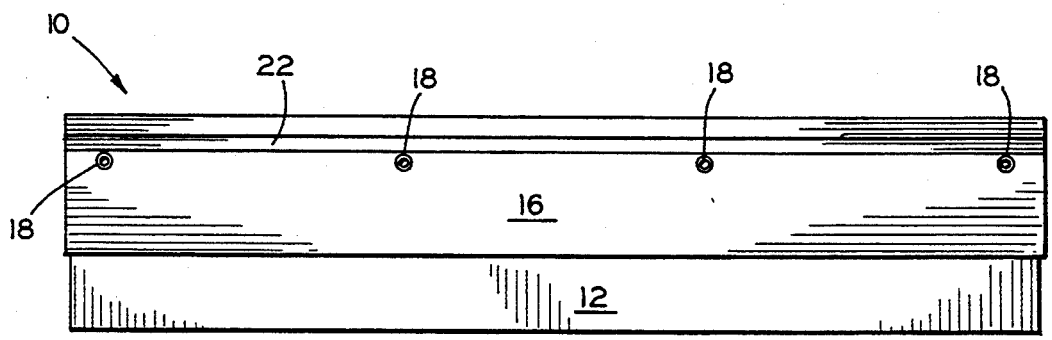
FIG. 2 is a back elevational view of the squeegee assembly.
Figure 3:
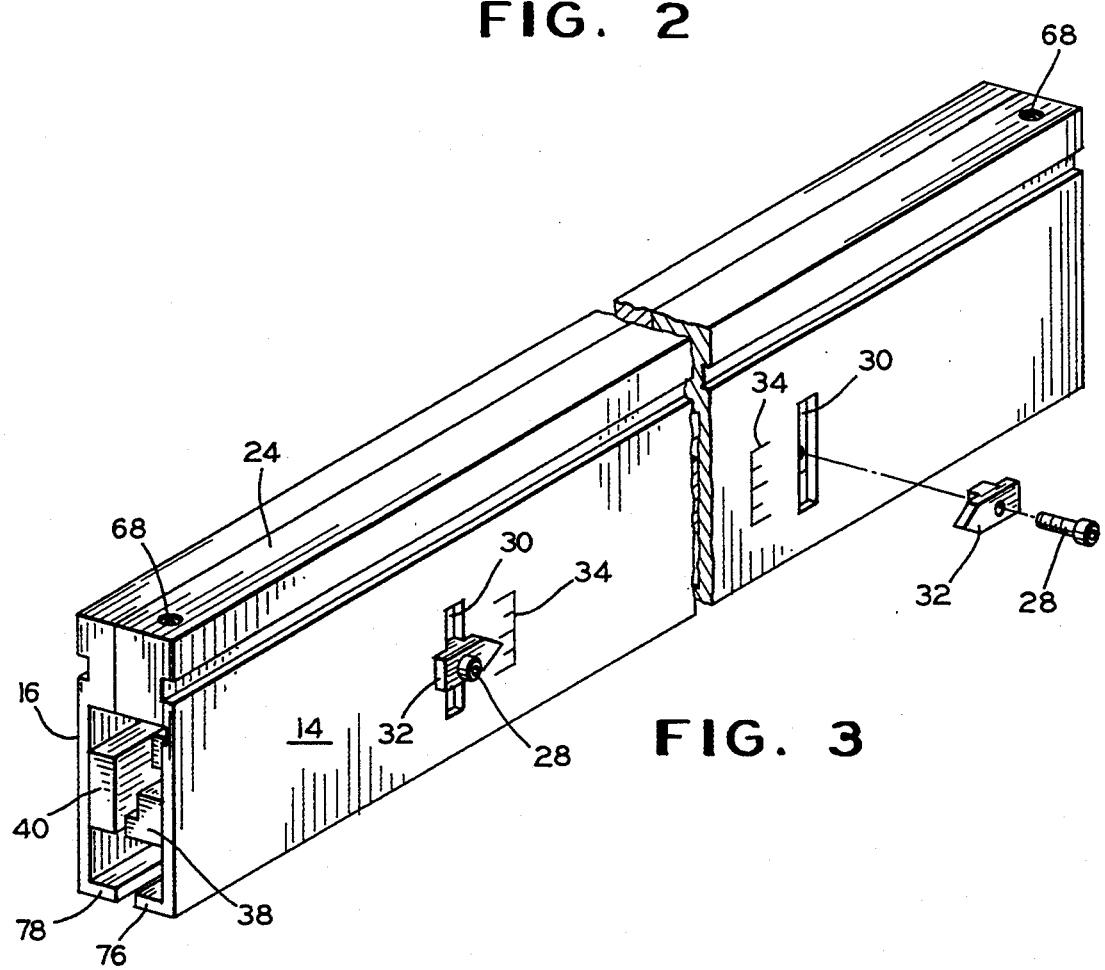
FIG. 3 is a perspective view of the squeegee assembly showing the two ends of the squeegee assembly.

Referring now to the drawings, there is shown in FIGS. 1 and 2 the squeegee assembly 10 of the present invention with a squeegee blade 12 extending from the assembly 10. The squeegee assembly 10 is secured to the carriage of a printing press for operation during the printing cycle.

The assembly 10 includes an outer enclosure formed by a front outer bracket 14 and a rear outer bracket 16 connected by a plurality of threaded bolts 18 spaced apart along the upper part of the outer brackets 14, 16. The bolts 18 are inserted into and extend through the rear outer bracket 16 and are threaded into the internal threaded aperture formed in the front outer bracket 14. The bolts 18 are recessed in the face of rear bracket 16 to prevent damage to the bolts 18 during handling of the squeegee assembly 10o A front channel 20 is formed in the longitudinal face of bracket 14, and a corresponding rear channel 22 is formed in the longitudinal face of bracket 16 adjacent the top edge 24 of the assembly 10.

The carriage of the printing press (not shown) includes a clamping mechanism to secure the squeegee assembly 10 to the carriage. The carriage of the printing press is used to position and move the squeegee assembly 10 across the screen, which forces ink through the screen during the printing process. A typical carriage clamp 26 is shown in the channels 20, 22 in FIG. 6.

The front outer bracket 14 of the squeegee assembly 10 includes two locking bolts 28 which lock the squeegee blade 12 in place for use in production. The longitudinal face of front bracket 14 is provided with a pair of slots 30 for acceptance of the locking bolts 28. The position indicators 32 and scale 34 permit the alignment of the squeegee blade 12 to be confirmed when the squeegee blade 12 is repositioned in the assembly 10.

The squeegee holder 36 is shown in FIGS. 3–6. The two primary components of the squeegee holder 36 are a front bar 38 and a rear bar 40 for securing and positioning the squeegee blade 12. The rear bar 40 is a rectangular shaped bar extending the full length of the blade 12. The front bar 38 also extends the full length of the blade 12 and includes a planar surface 42, an extended upper flange 44, and a shorter lower flange 46.

The upper flange 44 extends over and engages the upper surface 48 of the blade 12 for connection to the rear bar 40. The front bar 38 engages the front surface 52 of the blade 12 such that the lower flange 46 is retained in groove 50 of the blade 12. The rear bar 40 engages the upper portion of the rear surface 54 of the blade 12. When the front bar 38 and rear bar 40 are connected, an internal channel 47 is formed for receiving and securing the top edge 48 of the squeegee blade 12. The main body 56 of the squeegee 12 extends from the squeegee holder 36 at aperture 58 between the lower flange 46 and the rear bar 40.

The squeegee 12 is positioned in the internal channel 47 between the front bar 38 and rear bar 40 and is secured therebetween by the insertion of threaded bolts 60 into recessed bolt apertures 62 in the rear bar 40 and the tightening of the bolts 60 in the threaded apertures 64 in the front bar 38. The squeegee holder 36 is now assembled with the squeegee blade 12 and is ready for positioning between the front outer bracket 14 and the rear outer bracket 16.

Figure 4:
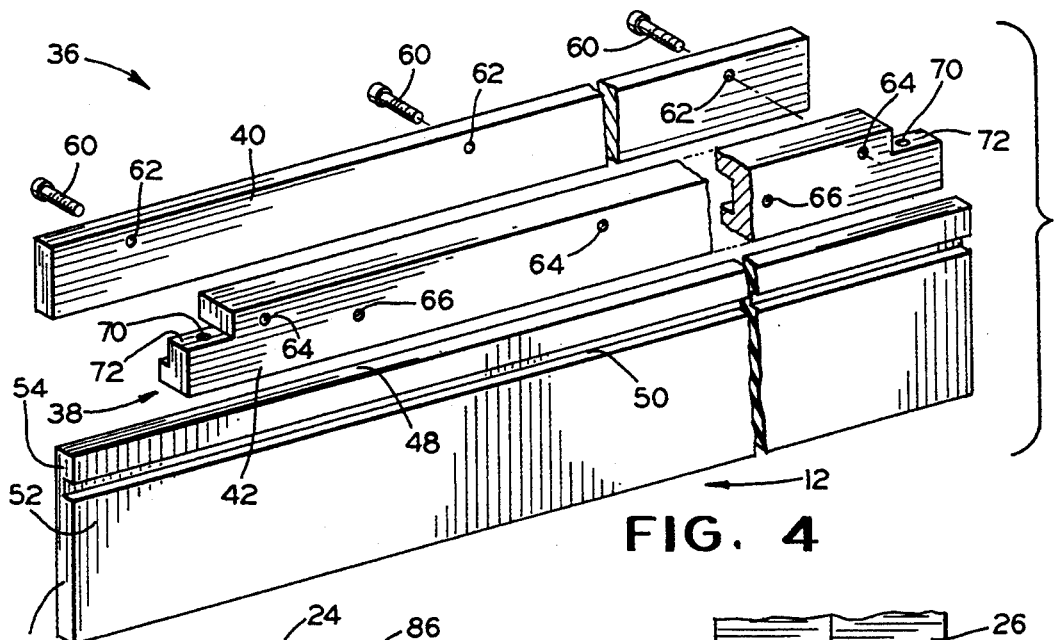
FIG. 4 is a perspective view of the two bar squeegee holder and the squeegee blade prior to subassembly.
Figure 5:
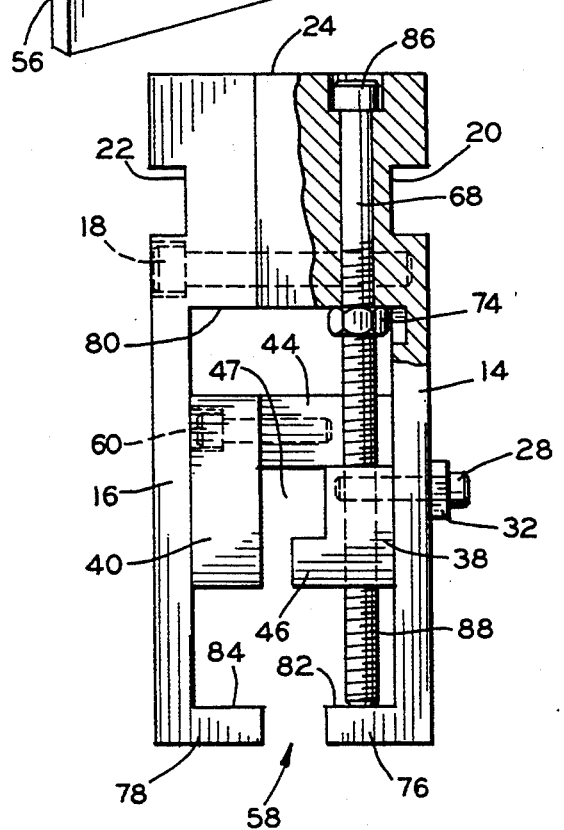
FIG. 5 is a side elevational view, partly in cross section, showing the squeegee holder, the outer brackets, and the positioning means.

In FIG. 4, threaded apertures 66 are positioned to receive locking bolts 28. The bolts 28 are fully tightened when the assembly is in use for printing operations. When the squeegee blade 12 is reconditioned and the position of blade 12 is adjusted, the locking bolts 28 are loosened to permit the squeegee holder 36 and squeegee blade 12 to move vertically within the range of the vertical slot 30 in the front bracket 14.

The threaded shaft 68 used to adjust the position of the squeegee holder 36 and squeegee blade 12 extends from the top edge 24 of the front outer bracket 14 vertically through the bracket 14 and nut 74, and through the threaded aperture 70 in the front bar 38 to the front flange 76 at the bottom of the front outer bracket 14. The front bar 38 has the corners cut away at each end 72 to permit the movement of the inner bracket 36 along the desired range of movement.

The front flange 76 and the rear flange 78 are spaced apart at one end to form slot 58 through which the blade 12 is extended. The flanges 76, 78 slidingly engage the blade 12 and provide support to the blade 12 when the blade 12 is flexed for printing operations.

The range of movement of the squeegee holder 36 and blade 12 is limited by the movement of the locking bolt 28 in the slot 30. The movement is similarly limited on the top end by the engagement of the upper flange 44 and rear bar 40 against the inner surface 80 formed by the outer brackets 14, 16, and on the bottom end by the engagement of the lower flange 46 and rear bar 40 against the flanges 76, 78. The front bar 38 slidingly engages the inner surface 82 of front outer bracket 14.

The rear bar 40 slidingly engages the inner surface 84 of the rear bracket 16.

The squeegee holder 36 and squeegee blade 12 are vertically positioned by rotating the head 86 of the threaded shaft 68. As the shaft 68 is rotated, the threads 88 of the shaft 68 engage the internal threads in threaded aperture 70 of the front bar 38. The shaft 68 can be rotated in either direction to raise and lower the squeegee holder 36 and blade 12.

To insert a squeegee blade 12 and assemble the assembly 10 for operation, a squeegee blade 12 is positioned such that the lower flange 46 of the front bar 38 is inserted in the groove 50 of the blade 12. The rear bar 40 is then aligned with the front bar 38 so that the bolts 60 may be tightened to secure the blade 12 between the front bar 38 and the rear bar 40 to form the squeegee holder 36.

The squeegee holder 36 is then aligned with the front outer bracket 14 such that locking bolt 28 may be inserted and connected to threaded aperture 66 to secure the squeegee holder 36 and the front outer bracket 14. The threaded shaft 68 is then inserted into the apertures at either end of the upper surface 24 of the front outer bracket 14. As the threaded shaft 68 is being inserted, nut 74 is screwed onto the threaded portion 88 of the shaft 68 to retain shaft 68 by engagement of the inner surface 80.

The threaded shaft 68 is then threaded through aperture 70 in the front bar 38 to eventually rest on inner surface 82 of flange 76. With a new blade 12 in the assembly 10, the locking bolt 28 is temporarily loosened and the squeegee holder 36 is fully retracted such that holder 36 engages the inner surface 80 of the front outer bracket 14.

The rear outer bracket 16 is then positioned such that the bolts 18 can be inserted and tightened to secure the squeegee holder 36 between the two outer brackets 14, 16. The squeegee blade 12 extends through slot 58. The main body 56 of the blade 12 engages the flanges 76, 78 at engagement points 94, 96 as shown in FIG. 6.

The assembly 10 is now ready to be mounted on a carriage for use in the screen printing process. The assembly is mounted by clamps 26 or other similar mounting means to the carriage of the printing press. As the squeegee blade 12 engages the screen, the leading edge 90, 92 in the direction of movement engages the screen and causes the body 56 of blade 12 to flex about flex points 94, 96. In some presses, the blade 12 is operated in both directions such that the leading edge 90, 92 would alternate. In other presses, the blade 12 operates in only one direction.

Figure 6:
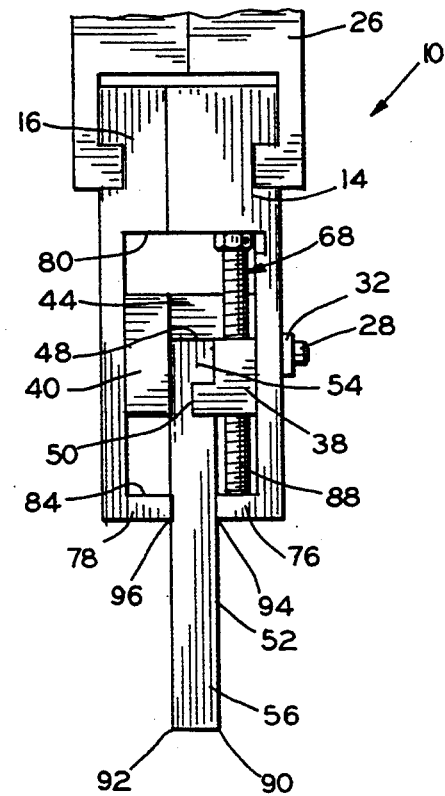
FIG. 6 is a side elevational view of the squeegee assembly showing the squeegee blade positioned in the assembly and the clamp used to secure the squeegee assembly to the carriage of the printing press.
Figure 7:
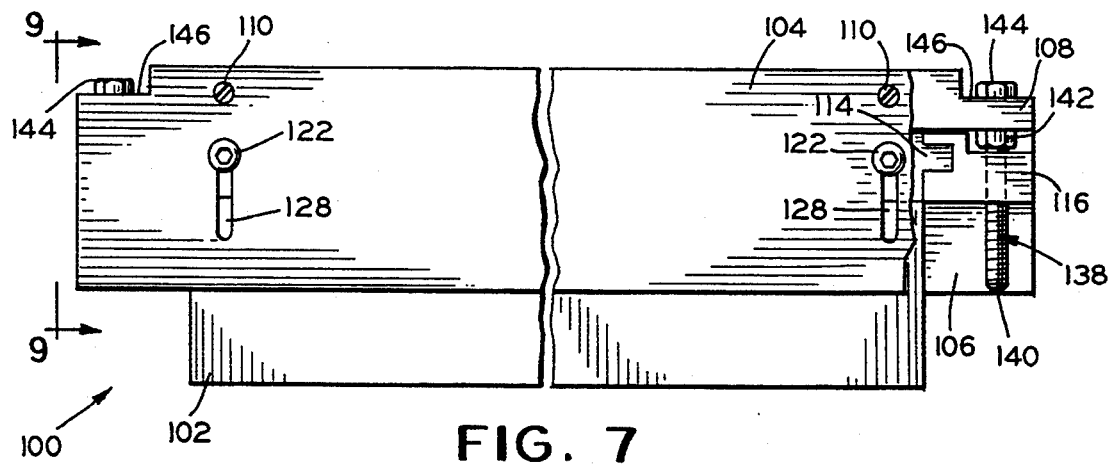
FIG. 7 is a front elevational view of a second embodiment of the squeegee assembly.
Figure 8:
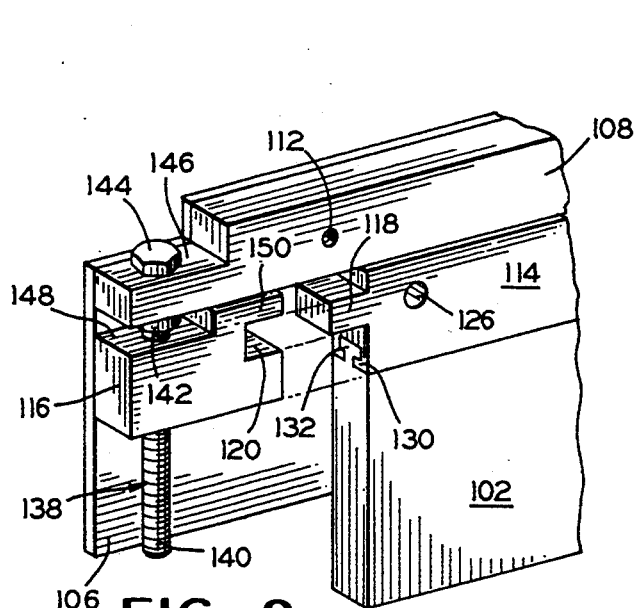
FIG. 8 is a perspective view of one end of the squeegee assembly of the second embodiment with a face plate removed to disclose the squeegee holder and the threaded shaft positioning means.
Figure 9:
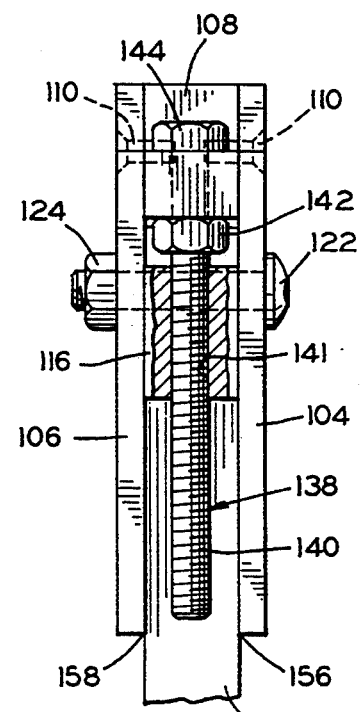
FIG. 9 is a side elevational view of the second embodiment of the squeegee assembly.

The blade 12 is shown in FIGS. 4 and 6. The blade has a generally rectangular cross section and includes an upper end 54 and a lower end 56. The blade 12 is made of hard rubber or other elastic material which presents a sharp edge to the surface of the printing screen throughout the travel of the blade 12 during a printing stroke. The deflection of the printing end 56 of the blade 12 is the result of the blade resilience, downward pressure on the squeegee assembly 10, and the frictional engagement of the leading edge 90, 92 of the blade 12 with the screen during a printing stroke.

The squeegee blades 12 in the present invention will generally be twice as tall, 4 to 5 inches, as a standard blade, 2 to 2.5 inches, for a nonadjustable squeegee assembly.

Many blades 12 are made from two different rubbers with different hardness. The harder rubber is used in the mounting end 54 to ensure proper engagement at the groove 50. The printing end 56 will be a softer rubber to provide an appropriate deflection of the blade 12 during the printing stroke.

Depending on the size of the screen mesh and the type of paint or ink being used, different blade pressures and different blade deflections may be preferred in the printing process.

One of the important factors in achieving an acceptable print is to have even pressure along the leading edges 90, 92 of the blade 12. The blade 12 has to be properly aligned when installed in the inner brackets 36. During operation of the press, the leading edges 90, 92 deteriorate from engagement with the screen and the pressure used to force the paint-ink through the screen. When the prints no longer meet acceptable quality standards, the leading edges 90, 92 must be reconditioned or the blade 12 must be replaced. The cost of the blade is significant enough such that it is preferable to recondition the blade 12.

To recondition a blade 12, the blade assembly 10 is generally removed from the carriage. The edge of the printing end 56 is cut off or sanded down to create new leading edges 90, 92. Special cutting systems and sanding systems have been developed to lock the assembly 10 in place to work on the blade 12. After the leading edges 90, 92 are sharp, the blade assembly 10 is ready for adjusting the length of the blade extension prior to mounting the assembly in the carriage of the printing press.

The initial extension of the squeegee blade 12 from the outer brackets 14, 16 will be set at the desired length. The extension of the squeegee blade can be measured from the edge 94, 96 of the outer brackets 14, 16 to the edge of the squeegee 90, 92. The length of the extension will be confirmed by hand measuring the extension at various points along the longitudinal edge of the assembly 10. The scale 34 on the bracket 14 provides an additional indication of the positioning of the squeegee blade 12 when making an adjustment. After each reconditioning, the blade 12 can be extended by temporarily loosening bolts 28 and turning the head 86 of the threaded shaft 68 to maintain the blade extension at the desired distance. The flexing of the blade 12 should remain relatively constant because the distance from the flex points 94, 96 to the edge 90, 92 of the blade 12 remain constant after every adjustment of the squeegee blade 12.

In high volume production operations, each carriage will have a plurality of assemblies 10 so that the printing press can remain in operation while a blade 12 is being reconditioned. The press will be shut down during the changing of the blade assembly 10. However, the press can be in operation with one assembly as the squeegee blade 12 on a second assembly is reconditioned or replaced.

When the blade 12 is uneven and nicked, the pressure on the screen is uneven, which causes light areas and stripes to appear on the substrate being printed. In addition, the blade 12 may snag or rip the screen. Screens are expensive and a ripped screen causes significant down time for an unscheduled screen change.

The major factors which effect the even printing pressure and the overall quality of the blade assembly operation are the angle at which the squeegee blade 12 extends from the assembly 10, the pressure transferred to the assembly 10 by the carriage operation of the press, the stiffness of the blade 12, and the length of the extension of the blade 12 which extends from the aperture 58 of the assembly 10. The number of production operations before a reconditioning or replacement of the blade 12 is required depends on the type and mesh size of the screen, the pressure on the blade 12, the ink used in printing, and the type and shape of the substrate being printed.

The majority of squeegee assemblies used in printing operations merely lock the squeegee blade in place and are nonadjustable. A blade may start out with a two inch segment extending from the assembly, with an acceptable extension being 1.5 to 2.0 inches for printing operations. After initial use, the blade is reconditioned and a one-quarter inch segment is cut away to provide the desired edge. The one and three-quarter inch squeegee extension is now mounted in the carriage of the printing press for operation. A second reconditioning reduces the extension of the blade from the assembly to about one and one-half inches. After using the assembly with a one and one-half inch blade extending from the assembly, the blade is no longer usable (not enough flex in a blade with less extension). The old blade is thrown out and a new blade is inserted for operation.

With a nonadjustable assembly, the pressure and positioning settings on the carriage of the printing press must be adjusted each time the blade is reconditioned. A shorter blade requires more pressure to achieve the desired flex to force ink through the screen. Since the blade is one-half inch shorter, the carriage must be adjusted to achieve the necessary engagement between the blade and the printing screen. When using an nonadjustable blade assembly, one or two prints are typically required to obtain the desired setting of the carriage. The adjustment of the press after each blade change results in added manpower responsibilities, lost production time, and significant amounts of scrap product.

The squeegee blades are relatively expensive such that periodically reconditioning the blades is preferable to changing the blade after a period of production use. In addition, the manpower time to change and align a blade in an assembly is often greater than the time to recondition the edge of a blade mounted and secured in the assembly.

In the above nonadjustable example (a two inch blade), the squeegee blade was used in three production sets with one-half inch of the blade being used and one and one-half inch being scrap. With two blades, the utilization becomes six production sets (including one blade change out), one inch blade use, and three inches blade scrap.

In the present invention with assembly 10 with one four inch blade 12, the blade 12 could initially be set at an extension of one and one-half inches and maintained at that extension after each reconditioning. The flex properties would remain approximately the same after each adjustment because the flex distance and the flex points 94, 96 are constant. For the four inch blade, the utilization would be eleven production sets (no blade changes), two and one-half inches blade use, and one and one-half inch blade scrap.

The squeegee assembly 10 of the present invention requires significantly fewer adjustments to the carriage of the printing press, which results in more efficient production time and less scrap substrate. Additional cost savings will be available because of the fewer blade changes and the reduction in scrap blade material. Achieving a properly aligned squeegee in an assembly without waves or buckles can be difficult. Squeegee problems are one of the most significant causes of quality problems in printing applications. The present invention 10 is easy to assemble and adjust, and provides measurable cost savings for production time, squeegee blade material, and substrate material.

Two additional embodiments of the present invention are shown in FIGS. 7-11. The assembly 100 includes a squeegee blade 102 positioned between two face plates, a planar front outer bracket 104 and a planar rear outer bracket 106.

A center bar 108 is used to secure the brackets 104, 106 in a spaced-apart relationship. The width of the center bar 108 is generally equal to the width of the squeegee blade 102. The center bar 108 is provided with two treaded apertures 112 on each horizontal face of the center bar 108. The brackets 104, 106 are secured to the center bar 108 by bolts 110 inserted through the bracket apertures into threaded aperture 112.

The internal structural components of assembly 100 include the squeegee blade holder 114 and two end brackets 116. The blade holder 114 is provided with an extension 118 on each end for interlocking with groove 120 in the end bracket 116 to secure the blade holder 114. A locking bolt 122 and nut 124 extends through the two outer brackets 104, 106 and aperture 126 of the blade holder 114. The two slots 128 in the front outer bracket 104 permit the locking bolt 122 to slide when the position of the blade holder 114 and blade 102 are being adjusted.

The lower edge 130 of the blade holder 114 and the upper edge 132 of the squeegee blade 102 are formed to provide a full length interlocking channel. When the blade 102 is replaced, the holder 114 must be removed and the blade 102 is pulled out either end of the holder 114. A replacement blade 102 is position at one end, the top edge 132 is inserted in the lower edge 130, and the blade 102 is pulled through to the other end of holder 114.

The top part 134 of blade 102 is made with a hard rubber to provide a firm edge for securing the blade 102. The lower part 136 of the blade 102 is made with a softer rubber to provide the desired flex during printing.

The end brackets 116 are interlinked with the squeegee blade holder 114 to position the blade in the desired location. A threaded shaft 138 is used in a similar manner to the first embodiment 10. The shaft 138 is inserted through the center bar 108 with nut 142 securing the shaft 138. The threaded end 140 is threaded into the internal threads 141 of the end bracket 116. The shaft head 144 is turned to raise and lower the end brackets 116, the blade holder 114, and the blade 102. When the blade 102 is fully retracted, the top 150 of the end bracket 116 engages the center bar 108 and the locking bolt 122 is at the top of the slot 128. The end bracket 116 includes a recessed area 148 to accommodate the nut 142. The squeegee blade 102 may be lowered until the bolt 122 reaches the bottom of the slot 128.

The top edge of the center bar 108 includes a recessed area 146 at each end to provide access from both the top and side for adjusting the position of the blade 102. From an operational standpoint, the side access to the shaft head 144 will be preferred by the operator of the press for ease in adjusting the position of the blade 102 when the assembly 100 is secured in the carriage of the printing press.

The operation and reconditioning procedures for the squeegee assembly 100 are similar to the procedures noted above for the first embodiment 10. The leading edges 152, 154 of squeegee blade 102 engage the screen during the printing process. The squeegee blade 102 is flexed about flex points 156, 158. The threaded shaft 138 is used to adjust the position of the blade 102 between the brackets 104, 106.

Figure 11:
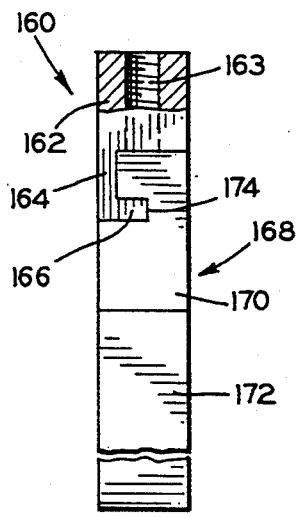
FIG. 11 is a side elevational view of the squeegee holder for a third embodiment having a single inner bracket for retaining the squeegee.
Figure 10:
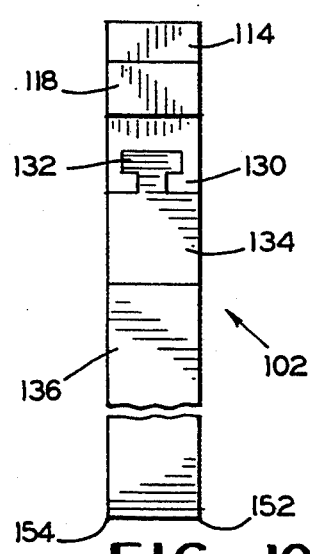
FIG. 10 is a side elevational view of the squeegee holder showing the mounting of the squeegee blade and the different hardness of material used to form the squeegee.

A squeegee holder 160 is shown in FIG. 11 as a third embodiment of the present invention. The squeegee holder 160 is mounted between outer brackets 104, 106 and center bar 108 similar to the squeegee blade holder 114 and end brackets 116 shown in FIG. 7. The primary difference is that the end brackets 116 and squeegee holder 114 are combined into one piece squeegee holder 160 extending the full longitudinal length of the squeegee assembly. The squeegee 168 is recessed from each end of the one piece squeegee holder 160 to permit the mounting of the threaded shaft 138 in the threaded opening 163 at each end of the squeegee holder 160.

The one piece squeegee holder 160 includes a longitudinal bar 162 having a bracket 164 with a flanged end 166 extending from the bar 162 to engage the groove 174 of the squeegee blade 168. The squeegee blade 168 includes a hard rubber upper segment 170 and a softer rubber lower segment 172.

The use of squeegee holder 160 provides the same thin configuration as squeegee assembly 100, but the squeegee blade 168 is easier to install in the holder 160. The major drawback is that the squeegee 168 may buckle or wave because of the means of securing the squeegee 168 between the outer brackets 104, 106. The operation and reconditioning procedures for an assembly with holder 160 are similar to the procedures noted above for the first embodiment 10 and the second embodiment 100.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An adjustable squeegee assembly for securing a squeegee blade in a screen printing apparatus, said adjustable squeegee assembly comprising:
   a) a squeegee blade including parallel first and second planar surfaces, a longitudinal print edge, a longitudinal mounting edge, and a longitudinal groove formed in the first planar surface adjacent the mounting edge, said squeegee blade having a composite construction including a first rubber component forming the longitudinal mounting edge and the longitudinal groove, and a second rubber component forming the balance of the squeegee blade, the first rubber component being harder than the second rubber component;
   b) elongate squeegee holder having a longitudinal channel for receiving and securably engaging said squeegee blade about the mounting edge, said squeegee holder including a longitudinal flange extending into the channel for insertion into the longitudinal groove of said squeegee blade;
   c) elongate external bracket means including a first face plate and a second face plate secured in spaced-apart relationship about said squeegee blade and said squeegee holder, the first face plate slidably engaging a first side of said squeegee holder and the first planar surface of said squeegee blade, and the second face plate slidably engaging a second side of said squeegee holder and the second planar surface of said squeegee blade, the print edge of said squeegee blade extending transversely from a longitudinally slotted aperture in said external bracket means; and
   d) positioning means mounted in said external bracket means and connected to said squeegee holder, said positioning means transversely positioning said holder within said external bracket means while the first face plate and second face plate are secured to each other such that the printing edge of said squeegee blade extending from the slotted aperture may be positioned at a specified distance from said external bracket means without removing said squeegee blade from said squeegee holder or from said external bracket means.

2. The squeegee assembly defined in claim 1 wherein said positioning means includes two threaded shafts, the threaded shafts being mounted on opposite ends of said external bracket means and extending transversely through threaded apertures in said squeegee holder, the threaded shafts being positioned between the first face plate and second face plate of said external bracket means adjacent a first side edge and a second side edge of said squeegee blade, whereby the rotation of said threaded shafts cause said squeegee holder and said squeegee blade to move transversely within said external bracket means.

3. The squeegee assembly defined in claim 2 wherein said external bracket means includes a longitudinal center bar secured between the first face plate and the second face plate and wherein the center bar, said squeegee holder and said squeegee blade all have approximately the same width such that the first and second face plates slidingly engage said squeegee holder and said squeegee blade.

4. The squeegee assembly defined in claim 2 wherein said squeegee holder includes two end pieces and a center segment extending longitudinally between the two end pieces, the end pieces and center segment having an interlocking means for securing the center segment in position, each end piece having a threaded aperture for receiving one of the two threaded shafts, and the center segment having the longitudinal channel for receiving and securing the mounting edge of said squeegee blade.

5. The squeegee assembly defined in claim 2 wherein said squeegee holder includes a single holder bar having one of said threaded apertures at each end for receiving each threaded shaft, and said holder bar including the longitudinal flange for engaging the groove of said squeegee blade to secure and position said squeegee blade.

6. An adjustable squeegee assembly for securing a squeegee blade in a screen printing apparatus, said adjustable squeegee assembly comprising:
   a) a squeegee blade including parallel first and second planar surfaces, a longitudinal print edge, a longitudinal mounting edge, and a longitudinal groove formed in the first planar surface adjacent the mounting edge;
   b) elongate squeegee holder having a longitudinal channel for receiving and securably engaging said squeegee blade about the mounting edge, said squeegee holder including a longitudinal flange extending into the channel for insertion into the longitudinal groove of said squeegee blade;
   c) elongate external bracket means including a first face plate and a second face plate secured in spaced-apart relationship about said squeegee blade and said squeegee holder, the first face plate slidably engaging a first side of said squeegee holder and the first planar surface of said squeegee blade, and the second face plate slidably engaging a second side of said squeegee holder and the second planar surface of said squeegee blade, the print edge of said squeegee blade extending transversely from a longitudinally slotted aperture in said external bracket means;

d) positioning means mounted in said external bracket means and connected to said squeegee holder, said positioning means including two threaded shafts, each threaded shaft inserted in and extending transversely through an aperture on a top edge of said external bracket means and extending transversely through a corresponding threaded aperture in said squeegee holder such that the rotation of the threaded shafts causes said squeegee holder and said squeegee blade to be transversely positioned within said external bracket means while the first face plate and second face plate are secured to each other such that the printing edge of said squeegee blade extending from the slotted aperture may be positioned at a specified distance from said external bracket means without removing said squeegee blade from said squeegee holder or from said external bracket means; and e) locking means for securing said squeegee holder and said squeegee blade in a specific position within said external bracket means during use of the squeegee assembly, said locking means including at least one locking bolt extending through a transverse slot in the first face plate of said external bracket and connecting to said squeegee holder such that the locking bolt may be loosened to adjust the position of said squeegee holder and tightened to lock said squeegee holder within said external bracket means.

7. The squeegee assembly defined in claim 6 wherein the first face plate of said external bracket means includes a scale marked on the face plate adjacent the transverse slot whereby the positioning of said squeegee holder and said squeegee blade may be monitored.

8. The squeegee assembly defined in claim 6 wherein said squeegee holder includes two longitudinal bars connected to form the longitudinal channel and flange for receiving and securably engaging the mounting edge of said squeegee blade, the longitudinal bars of said squeegee holder including the threaded apertures for receiving each threaded shaft such that the threaded shafts are positioned between, and spaced apart from, the planar surfaces of said squeegee blade and the corresponding face plates of said external bracket means.

9. The squeegee assembly defined in claim 6 wherein the threaded shafts are positioned between the first face plate and second face plate of said external bracket means adjacent a first side edge and a second side edge of said squeegee blade, whereby the rotation of said threaded shafts cause said squeegee holder and said squeegee blade to move transversely within said external bracket means.

10. The squeegee assembly defined in claim 9 wherein said external bracket means includes a longitudinal center bar secured between the first face plate and the second face plate and wherein the center bar, said squeegee holder and said squeegee blade all have approximately the same width such that the first and second face plates slidingly engage said squeegee holder and said squeegee blade.

11. The squeegee assembly defined in claim 9 wherein said squeegee holder includes two end pieces and a center segment extending longitudinally between the two end pieces, the end pieces and center segment having an interlocking means for securing the center segment in position, each end piece having the threaded aperture for receiving one of the two threaded shafts, and the center segment having the longitudinal channel for receiving and securing the mounting edge of said squeegee blade.

12. The squeegee assembly defined in claim 9 wherein said squeegee holder includes the single holder bar having the threaded aperture at each end for receiving a threaded shaft, and said holder bar including the longitudinal flange for engaging the groove of said squeegee blade to secure and position said squeegee blade.

13. An adjustable squeegee assembly for securing a squeegee blade in a screen printing apparatus, said adjustable squeegee assembly comprising:

a) a squeegee blade including parallel first and second planar surfaces, a longitudinal print edge, a longitudinal mounting edge, and a longitudinal groove formed in the first planar surface adjacent the mounting edge;

b) elongate squeegee holder having a longitudinal channel for receiving and securably engaging said squeegee blade about the mounting edge, said squeegee holder including a longitudinal flange extending into the channel for insertion into the longitudinal groove of said squeegee blade;

c) elongate external bracket means including a first face plate and a second face plate secured in spaced-apart relationship about said squeegee blade and said squeegee holder, the first face plate slidably engaging a first side of said squeegee holder and the first planar surface of said squeegee blade, and the second face plate slidably engaging a second side of said squeegee holder and the second planar surface of said squeegee blade, the print edge of said squeegee blade extending transversely from a longitudinally slotted aperture in said external bracket means;

d) positioning means mounted in said external bracket means and connected to said squeegee holder, said positioning means including two threaded shafts offset from the longitudinal mounting edge of said squeegee blade, each threaded shaft inserted in and extending transversely through an aperture on a top edge of said external bracket means and extending transversely through a corresponding threaded aperture in said squeegee holder past the mounting edge of said squeegee, the selective rotation of the threaded shafts causing said squeegee holder and said squeegee blade to be transversely positioned within said external bracket means such that the printing edge of said squeegee blade extending from the slotted aperture may be positioned at a specified distance from said external bracket means without removing said squeegee blade from said squeegee holder or disconnecting said external bracket means.

14. The squeegee assembly defined in claim 13 wherein said squeegee holder includes two longitudinal bars connected to form the longitudinal channel and flange for receiving and securably engaging the mounting edge of said squeegee blade, the longitudinal bars of said squeegee holder including the threaded aperture for receiving each threaded shaft such that the threaded shafts are positioned between, and spaced apart from, the planar surfaces of said squeegee blade and the corresponding face plates of said external bracket means.

15. The squeegee assembly defined in claim 13 wherein the threaded shafts are positioned between the first face plate and second face plate of said external bracket means adjacent a first side edge and a second side edge of said squeegee blade, whereby the rotation of said threaded shafts cause said squeegee holder and said squeegee blade to move transversely within said external bracket means.

16. The squeegee assembly defined in claim 15 wherein said external bracket means includes a longitudinal center bar secured between the first face plate and the second face plate and wherein the center bar, said squeegee holder and said squeegee blade all have approximately the same width such that the first and second face plates slidingly engage said squeegee holder and said squeegee blade.

* * * * *